(12) United States Patent
Chong et al.

(10) Patent No.: US 7,718,987 B2
(45) Date of Patent: May 18, 2010

(54) ELECTRICALLY WRITABLE AND ERASABLE MEMORY MEDIUM HAVING A DATA ELEMENT WITH TWO OR MORE MULTIPLE-LAYER STRUCTURES MADE OF INDIVIDUAL LAYERS

(75) Inventors: Tow Chong Chong, Singapore (SG); Lu Ping Shi, Singapore (SG); Rong Zhao, Singapore (SG); Xiang Shui Miao, Singapore (SG); Pik Kee Tan, Singapore (SG); Hao Meng, S.E. Minneapolis, MN (US); Kai Jun Yi, Lincoln, NE (US); Xiang Hu, Singapore (SG); Ke Bin Li, Singapore (SG); Ping Luo, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 0 days.

(21) Appl. No.: 10/589,915

(22) PCT Filed: Jan. 27, 2005

(86) PCT No.: PCT/SG2005/000022

§ 371 (c)(1),
(2), (4) Date: Jul. 18, 2007

(87) PCT Pub. No.: WO2005/081256

PCT Pub. Date: Sep. 1, 2005

(65) Prior Publication Data

US 2008/0001136 A1   Jan. 3, 2008

(30) Foreign Application Priority Data

Feb. 19, 2004   (SG) .............................. 200400804-1

(51) Int. Cl.
*H01L 29/02* (2006.01)

(52) U.S. Cl. .................... 257/2; 257/E45.002; 257/52; 257/750
(58) Field of Classification Search ................. 257/314, 257/613, 2–5, E45.002; 711/104
See application file for complete search history.

(56) References Cited

U.S. PATENT DOCUMENTS 4,177,475 A   12/1979   Holmberg (Continued)

FOREIGN PATENT DOCUMENTS

EP   1 202 285 A2   5/2002

*Primary Examiner*—Lex Malsawma
*Assistant Examiner*—Robert Huber
(74) *Attorney, Agent, or Firm*—Fish & Richardson P.C.

(57) ABSTRACT

A memory cell for an electrically writeable and erasable memory medium as well as a memory medium thereof is provided. The memory cell comprises a data recording element, the data recording element has a plurality of multiple-layer structure disposed one on top of another; each the multiple-layer structure comprising a plurality of sequentially disposed individual layers. At least one of the plurality of individual layers is capable of changing phase between a crystalline state and an amorphous state in response to an electrical pulse, one of the plurality of individual layers having at least one atomic element which is absent from other one of the plurality of individual layers, and the plurality of multiple-layer structure is of a superlattice-like structure to lower a heat diffusion out of the data recording element to shorten a phase change time of the respective individual layers.

26 Claims, 6 Drawing Sheets

U.S. PATENT DOCUMENTS

| | | |
|---|---|---|
| 4,203,123 A | 5/1980 | Shanks |
| 5,063,097 A * | 11/1991 | Hirota et al. ............... 428/64.6 |
| 5,363,329 A | 11/1994 | Troyan |
| 5,837,564 A * | 11/1998 | Sandhu et al. ................ 438/95 |
| 6,507,061 B1 | 1/2003 | Klersy et al. |
| 2002/0131309 A1 * | 9/2002 | Nishihara et al. ........... 365/200 |
| 2003/0155589 A1 | 8/2003 | Campbell et al. |
| 2004/0026730 A1 | 2/2004 | Kostylev et al. |
| 2004/0106065 A1 * | 6/2004 | Miyamoto et al. ..... 430/270.13 |
| 2005/0051901 A1 * | 3/2005 | Chen .......................... 257/758 |

\* cited by examiner

ELECTRICALLY WRITABLE AND ERASABLE MEMORY MEDIUM HAVING A DATA ELEMENT WITH TWO OR MORE MULTIPLE-LAYER STRUCTURES MADE OF INDIVIDUAL LAYERS

CROSS-REFERENCE TO RELATED APPLICATIONS

This application is the National Stage of International Application No. PCT/SG2005/000022, filed Jan. 27, 2005, which claims the benefit of Singapore Patent Application Serial No. 200400804-1, filed on Feb. 19, 2004. The contents of both of the foregoing applications are hereby incorporated by reference in their entity.

FIELD OF THE INVENTION

The present invention relates to a solid state data storage medium. In particular, it relates to an electrically writeable and erasable solid state memory medium.

BACKGROUND OF THE INVENTION

To meet the demand of the data storage industry, various types of media are developed for data storage purposes, which include magnetic storage devices such as hard discs and floppy discs; optical storage discs such as CD-ROMs, CD-Rs, CD-RWs; as well as solid state memory devices, such as RAMs, ROMs, flash memories, dynamic random access memories (DRAMs).

Developed in the 1970s, the chalcogenide-based random access memory (C-RAM) is one type of the solid state memory which is electrically writeable and erasable. A C-RAM is an inexpensive, non-volatile memory device that is virtually impervious to radiation damage or hostile electronic interrogation, and therefore has commercial potential as a memory product for computing and data storage field, with applications ranging from smart appliances and desktop computers to new kinds of consumer products.

Figure 1:
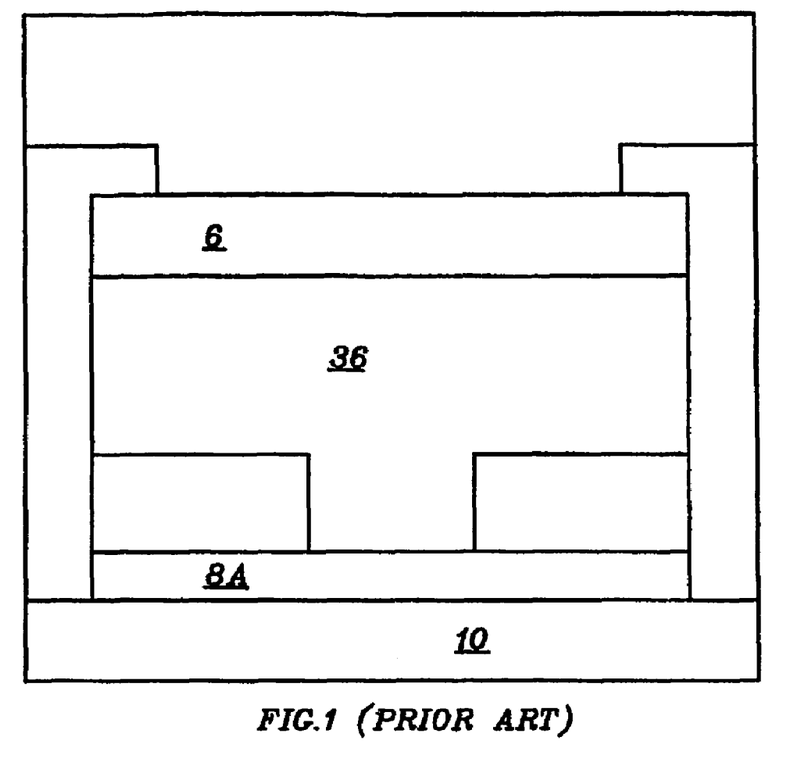
FIG. 1 is an enlarged cross sectional view of a prior art electrically writeable and erasable memory medium.

A conventional type of C-RAM device is disclosed in, for example, U.S. Pat. No. 5,912,839 issued to Ovshinsky et al, as shown in FIG. 1. This type of C-RAM device comprises a single crystal silicon semiconductor wafer 10 as a substrate, a memory material 36 of a single phase-change layer structure formed on the substrate, a first spacedly disposed contact 6 adjoining the volume of memory material 36, and a second spacedly disposed contact 8A adjoining the volume of memory material 36.

One of the key features of the C-RAM for storing data is its phase-change ability between the amorphous state and the crystalline state when an external energy is applied, such as an electrical current. In the data-writing process, a tiny volume of phase-change medium of the C-RAM memory element is melted by being heated with sufficient electrical energy to a temperature above its melting point, and rapidly cooled to room temperature to form the general amorphous state. In the data-erasing process, the phase-change medium is annealed at a temperature between the crystallizing temperature and the melting point to form the crystalline state.

One of the important criteria to access the phase-change ability is the data-transfer rate which is dependent on the attainable crystallization speed from the amorphous state to the crystalline state. Studies have shown that for the type of C-RAM device disclosed in the Ovshinsky's patent, in order to complete the phase-change process, the electrical current must have a pulse width of at least 50 to 200 nanoseconds (ns). When the pulse width is shortened beyond this limit, e.g. 20 ns, the device will not response with necessary phase change. Therefore, problems may arise, in particular, when the crystallization speed is not high enough to match the speed with which the electrical current passes over the medium. In such a case, the amorphous regions from the previous recording cannot be completely recrystallized during the data writing process. This causes data-recording distortion and a high level of noise.

One approach to increase the data transfer rate, or switching speed in C-RAM device is the adoption of stoichiometic compound phase-change materials as the memory material. Materials based on various different proportions of Ge—Sb—Te have also been investigated. Studies show that however, the switching speed of a regular stoichiometic phase-change material, such as $Ge_1Sb_2Te_4$ or $Ge_2Sb_2Te_5$ is about 50 ns to 100 ns. Therefore, these attempts have not presented a significant improvement on the switching speed of C-RAM devices.

There is therefore a need to provide an improved electrically writeable and erasable memory medium having a high data transfer rate, i.e. the medium is capable of changing phase in a shorter time of, for example, below 20 ns.

SUMMARY OF THE INVENTION

It is an object of the present invention to provide an electrically writeable and erasable memory medium for data storage, which has a significantly reduced access time than that existing in the prior technology.

In accordance with a first aspect of the present invention, there is provided a data recording element for a memory cell of a writeable and erasable memory medium. The data recording element has a laminated structure of two or more multiple-layer structures. Each said multiple-layer structure comprises a plurality of sequentially disposed individual layers. At least one of the plurality of individual layers in each multiple-layer structure is formed of a material capable of changing phase between a crystalline state and an amorphous state in response to an electrical pulse. One of the plurality of individual layers is made of a material having at least one atomic element which is absent from other one of the plurality of individual layers. The multiple-layer structure lowers a heat diffusion out of the data recording element. Energy loss due to the heat diffusion is reduced and accordingly, phase change time of the respective individual layers is shortened hence a high data transfer rate can be obtained.

Preferably, the plurality of sequentially disposed individual layers are disposed in the same sequence in at least two said multiple-layer structures.

Alternatively, the plurality of sequentially disposed individual layers are disposed in a different sequence in at least two said multiple-layer structures.

Preferably, each individual layer has a thickness in a range of about 0.1 nm to about 10 mn and more preferably, all the individual layers have the same thickness.

Alternatively, the ratio of thickness of any two of the individual layers ranges from about 0.1 to about 10.

Preferably, the total thickness of the individual layers is in a range of about 5 nm to about 500 nm and more preferably, the total thickness of the individual layers is in a range of about 5 nm to 100 nm.

Preferably, the resistance of said at least one individual layer in the crystalline state is lower than that in the amorphous state.

In accordance with a second aspect of the present invention, there is provided a memory cell for an electrically writeable and erasable memory medium as well as a memory medium thereof, the memory cell comprises a data recording layer, wherein the data recording layer forms a superlattice-like structure.

Preferably, the thermal conductivity of the superlattice-like structure is reduced by varying at least one of the compositional materials, the superlattice period and the thickness of the structure.

In accordance with a third aspect of the present invention, there is provided a method of producing a data recording element for a memory cell of electrically writeable and erasable memory medium. The method comprises depositing a first multiple-layer structure on a substrate and depositing one or more further multiple-layer structures on said first multiple-layer structure to form a laminated structure. Said first or further multiple-layer structure has at least two individual layers, at least one of said individual layers is formed of a material capable of changing phase between a crystalline state and an amorphous state in response to an electrical pulse, and one individual layer is made of a material having at least one atomic element which is absent from another individual layer.

Preferably, depositing a first or further multiple-layer structure includes sequentially depositing a first individual layer of a first material and one or more further individual layers of a further material different from said first material.

DETAILED DESCRIPTION OF THE PREFERRED EMBODIMENTS

Figure 2A:
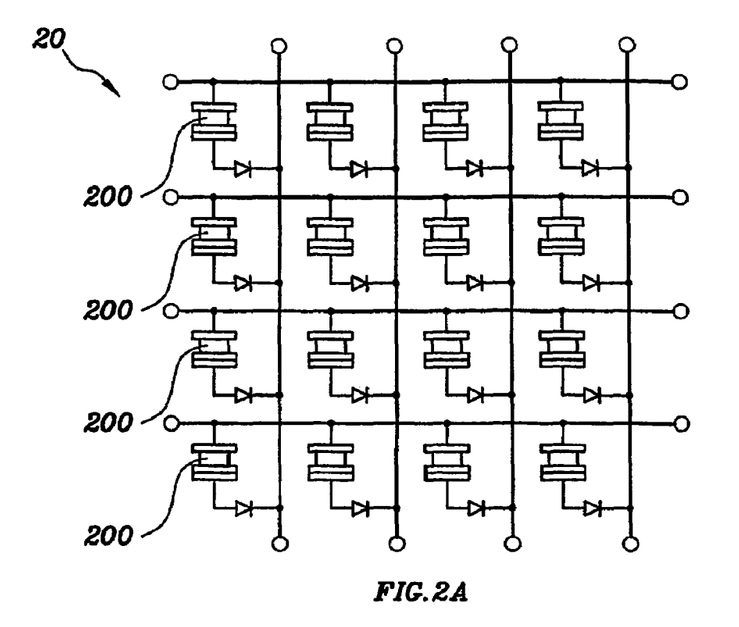
FIG. 2A is a schematic diagram showing an electrically writeable and erasable memory medium according to the present invention.
Figure 2B:
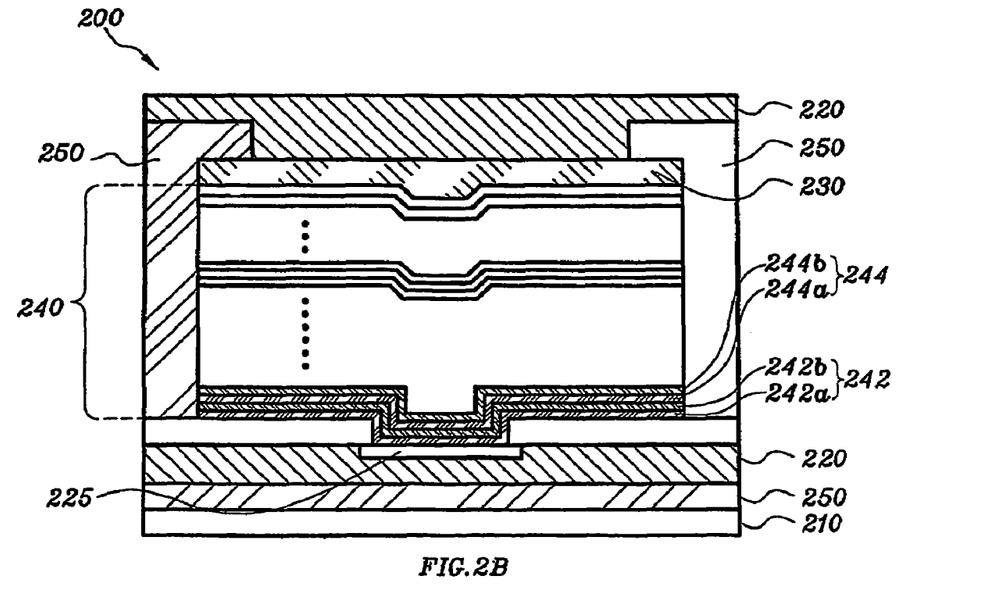
FIG. 2B is an enlarged cross sectional view of a memory cell of the electrically writeable and erasable memory medium according to one embodiment of the present invention.

As shown in FIGS. 2A and 2B, a memory cell 200 of an electrically writeable and erasable memory medium 20 according to one embodiment of the present invention comprises a substrate such as a semiconductor wafer 210, a first contact 220 and a second contact 230 formed on the substrate 210. A data recording element 240 is formed between the first and the second contacts 220 and 230, and an insulating material 250 is provided for isolating the memory cell from other cells. A high temperature electrode 225 is formed adjacent the data recording element 240. In the memory medium 20, there are formed an array of two-dimensional or three-dimensional memory cells 200.

The data recording element 240 comprises a plurality of multiple-layer structures 242, 244, and each multiple-layer structure 242, 244 comprises at least two sequentially disposed individual layers 242a, 242b and 244a, 244b, respectively. The individual layers in each multiple-layer structure 242, 244, i.e. individual layers 242a and 242b, are formed of different materials, and at least one of the individual layers 242a or 242b is formed of phase-change material. When referring to different materials forming the individual layers 242a, 242b and 244a, 244b, etc, it includes a situation where at least one of the individual layers is made of a material having at least one atomic element which is absent from other one of the individual layers. The phase-change material may be one or more selected from the group of elements or alloys including Ge, Te, Sb, Ag, GeTe, SbTe, AgIn, GeSbTe, AgInSbTe, TeAsGe, TeSeS, TeSeSb, InSbTe, TeGeSn, In, Cr, N, Se, Sn, Si, Bi and Ag. Likewise, the individual layers 244a and 244b in the second multiple-layer structure 244 may be formed of the respective same material as individual layers 242a and 242b.

In one embodiment, the at least one of the plurality of individual layers is deposited in the crystalline state to provide crystalline cores to shorten the phase change time of the respective individual layers. In another embodiment, the at least one of the plurality of individual layers has a resistance in the crystalline state, which is lower than that in the amorphous state.

In one embodiment, the first individual layers 242a and 244a in each multiple-layer structure are formed of one type of material, such as $Sb_2Te_3$, and the second individual layers 242b and 244b in each multiple-layer structure are formed of another type of material, such as GeTe. In this embodiment, individual layer 242a, formed of $Sb_2Te_3$, has the atomic element Sb which is absent from the material GeTe forming another individual layer 242b.

According to one embodiment of the present invention, the plurality of multiple-layer structures and the individual layers thereof fulfill the form according to the following expression:

$$(P_{11}, P_{12}, \ldots, P_{1m_1})_1, (P_{21}, P_{22}, \ldots, P_{2m_2})_2, \ldots, (P_{j1}, P_{j2}, \ldots, P_{jm_j})_n, \quad (1)$$

where $m_i$ denotes the number of layers in each multiple-layer structure and $m_1 \geqq 2$;

n denotes the total number of multiple-layer structure of layers and $n \geqq 2$;

j denotes the multiple-layer structure sequence number and $j \geqq 1$;

$P_{j1}, P_{j2}, \ldots, P_{jm_j}$ denote different candidate of materials;

$(P_{j1}, P_{j2}, \ldots, P_{jm_j})$ denotes one multiple-layer structure of the recording layer.

The term "multiple-layer structure sequence number" in this context refers to a sequence that the respective individual layers in one multiple-layer structure are disposed. For example, given $m_i=4$ and $n=2$, when $j=1$, the multiple-layer structure is of the form:

$$(P_{11}, P_{12}, P_{13}, P_{14})_1, (P_{11}, P_{12}, P_{13}, P_{14})_2, \quad (1.1)$$

in which the individual layers in the second multiple-layer structure are disposed in the same sequence as those of the first multiple-layer structure.

when j=2, the multiple-layer structure is of the form:

$$(P_{11}, P_{12}, P_{13}, P_{14})_1, (P_{21}, P_{22}, P_{23}, P_{24})_2, \quad (1.2)$$

in which the individual layers in the second multiple-layer structure may be formed of respective same material as those of the first multiple-layer structure, but are disposed in a difference sequence as those of the first multiple-layer structure.

Each individual layer $P_{jm_i}$ has a thickness of about 0.1 to 10 nm. In one preferred embodiment, the individual layers have the same thickness. The total thickness of the recording layer lies with the range between about 5 nm to about 500 nm, i.e.

$$5 \text{ nm} \leq \sum_{i=1,j=1}^{n} tp_{jm_i} \leq 500 \text{ nm}$$

where $tp_{jm_i}$ denotes the thickness of each individual layer.

In a more preferred embodiment, the total thickness of the recording layer lies with the range between about 5 nm to about 100 nm.

Alternatively, the ratio of the thickness of any two neighboring layers is in a range of about 0.1 to 10, i.e.

$$0.1 \leq \frac{tp_{jm_i}}{tp_{jm_k}} \leq 10$$

where $P_{jm_k}$ denotes a neighboring layer of an individual layer $P_{jm_i}$.

By varying the material and the thickness of the individual layers, the data recording element 240 maybe formed of a superlattice-like structure with desired thermal properties for the electrically writeable and erasable memory medium of the present invention.

According to another embodiment of the present invention, the plurality of multiple-layer structure of recording layers is of the form $$(P_{11}, P_{12}, \ldots, P_{1m_1})_1, (P_{21}, P_{22}, \ldots, P_{2m_2})_2, \ldots, (P_{j1}, P_{j2}, \ldots, P_{jm_j})_n, P_{11} \quad (2)$$

in which the symbols has the same meaning as that under expression (1) above and in addition, the plurality of multiple-layer structures further comprises a final individual layer which is the same as the individual layer $P_{11}$ firstly disposed.

According to one embodiment of the present invention, both the first individual layer and the final individual layer have a crystallization speed higher than that of other layers of the multiple-layer structure, and have a crystallization temperature lower than that of other layers of the multiple-layer structure. Preferably, the crystallization temperature of said first individual layer and final individual layer is in a range of about 90° C. to 120° C.

In the present invention, the term "superlattice-like" is used to refer to the novel structure adopted for the electrically writeable and erasable memory medium. This structure can be prepared by alternative deposition of two or more layers so as to form periodically repeating multiple-layer structures of phase-change layers. Such a structure, however, may not be limited or strictly fulfill the criteria of a superlattice structure generally used in bandgap engineering in which the layer thickness is required to be smaller than the carrier's Bohr radius, for example. An electrically writeable and erasable memory medium according to the present invention defines a structure for the data recording element with a focus on the electrical and thermal properties.

The multiple-layer or superlattice-like structure used in the present invention is formed in an aim to improve the performance of the electrically writeable and erasable memory medium in many aspects, including increasing switching speed, reducing the access time, increasing device reliability, and reducing the programming current. In the present invention, the multiple-layer or superlattice-like structure, being made of materials with different atomic elements or compositions between the each individual layers, contributes mainly to the reduction of thermal conductivity between the individual layers, and the reduction of heat diffusion out of the data recording element. As a result, the temperature rise time can be shortened, which leads to a reduction of the phase change time to a level significantly shorter than that of the prior art C-RAMs. With the decrease of the in-plane and cross-plane thermal conductivity, the heat diffusion from the data recording element to the other part of the medium can be slowed down. As a result, the programming current can be significantly reduced. The phase transition temperature and the activation energy can also be adjusted, thus the recrystallization time can be shortened.

Further, a barrier effect is generated between the individual layers of the multiple-layer or superlattice-like structure of the data recording element, which assists to suppress atomic diffusion, thus to reduce the mutual diffusion between the data recording element and other part of the medium and to prevent signal deterioration after many overwrite cycles.

Figure 3:
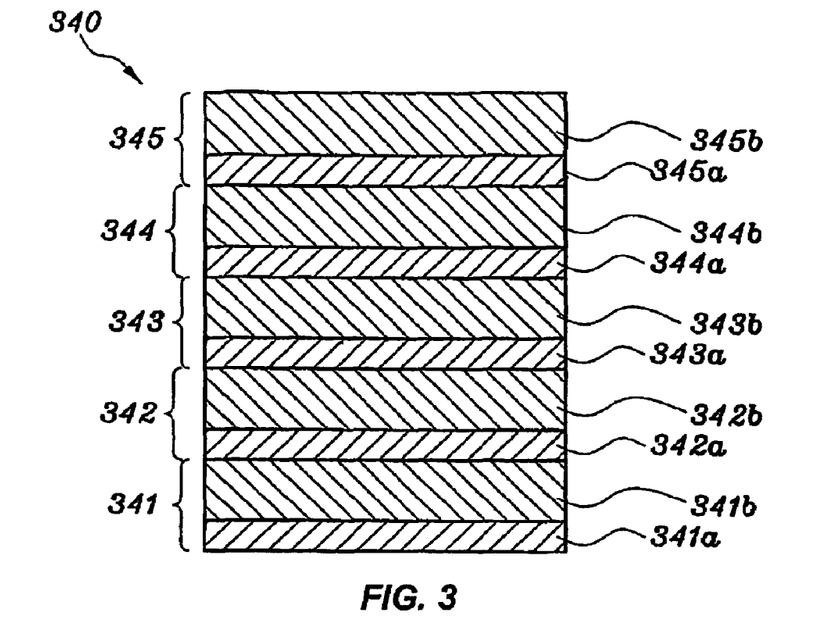
FIG. 3 is an enlarged cross sectional view of a data recording element of a memory cell for an electrically writeable and erasable memory medium according to another embodiment of the present invention.

FIG. 3 shows a structure of data recording element 340 of a memory cell for an electrically writeable and erasable memory medium according to another embodiment of the present invention. The data recording element 340 comprises a first multiple-layer structure 341, a second multiple-layer structure 342 disposed on the first multiple-layer structure 341, a third multiple-layer structure 343 disposed on the second multiple-layer structure 342, a fourth multiple layer-structure 344 disposed on the third multiple-layer structure 343, and a fifth multiple-layer structure 345 disposed on the fourth multiple-layer structure 344. The first multiple-layer structure 341 comprises two individual layers 341a and 341b. The second multiple-layer structure 342 comprises two individual layers 342a and 342b. The third multiple-layer structure 343 comprises two individual layers 343a and 343b. The fourth multiple-layer structure 344 comprises two individual layers 344a and 344b. The fifth multiple-layer structure 345 comprises two individual layers 345a and 345b. The ten individual layers 341a, 341b, 342a, 342b, 343a, 343b, 344a, 344b, 345a and 345b are alternately disposed as shown in FIG. 3. In one specific example, the first individual layers 341a, 342a, 343a, 344a, and 345a of each multiple-layer structure are formed of $Sb_2Te_3$ and each has a thickness of about 5.2 nm. The second individual layers 341b, 342b, 343b, 344b, and 345b of each multiple-layer structure are formed of GeTe and each has a thickness of about 2.6 nm.

It can be appreciated that in the embodiment shown in FIG. 3, the parameters referred to in expression (1) above have the following values: the number of multiple-layer structure is 5 (i.e. n=5); each multiple-layer structure comprises two individual layers (i.e. $m_i$=2). Since the individual layers in each multiple-layer structure are disposed in the same sequence (i.e. a GeTe on top of a $Sb_2Te_3$ layer, the multiple-layer structure sequence number j=1).

The total thickness of the data recording element 340 is the addition of the thickness of the ten individual layers 341a, 341b, 342a, 342b, 343a, 343b, 344a, 344b, 345a and 345b, which is 39 nm. The ratio of thickness of two neighboring layers (e.g. layers 341a and 341b) is 5.2/2.6=2.0, and the ratio of thickness of other two neighboring layers (e.g. layers 341b and 342a) is 2.6/5.2=0.5.

Figure 4:
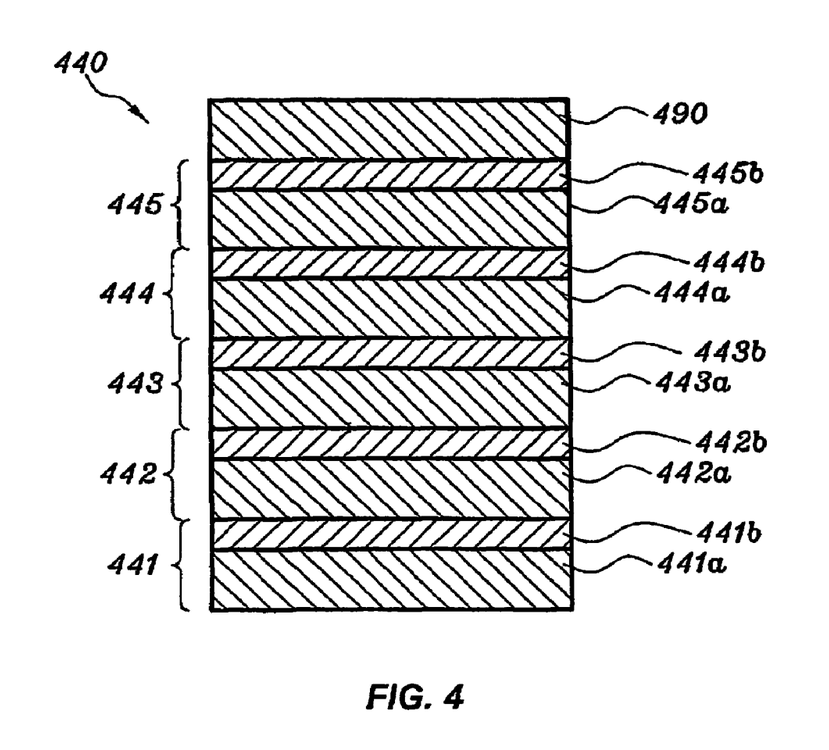
FIG. 4 is an enlarged cross sectional view of a data recording element of a memory cell for an electrically writeable and erasable memory medium according to a further embodiment of the present invention.

FIG. 4 shows a structure of data recording element 440 of a memory cell for an electrically writeable and erasable memory medium according to a further embodiment of the present invention. In this embodiment, ten individual layers 441a, 441b, 442a, 442b, 443a, 443b, 444a, 444b, 445a and 445b are alternately disposed as shown in FIG. 4. A final individual layer 490 is disposed on top of the individual layer 445b. In one specific example, the first individual layers 441a, 442a, 443a, 444a, and 445a of each multiple-layer structure are formed of $Sb_2Te_3$ and each has a thickness of about 5.2 nm. The second individual layers 441b, 442b, 443b, 444b, and 445b of each multiple-layer structure are formed of GeTe and each has a thickness of about 2.6 nm. The final layer 490 is formed of $Sb_2Te_3$ and has a thickness of about 5.2 nm, which is the same as that of the first individual layer 441a. It should be appreciated that this embodiment corresponds to the structure under expression (2) above, and has a total thickness of about 41.6 nm.

Figure 5A:
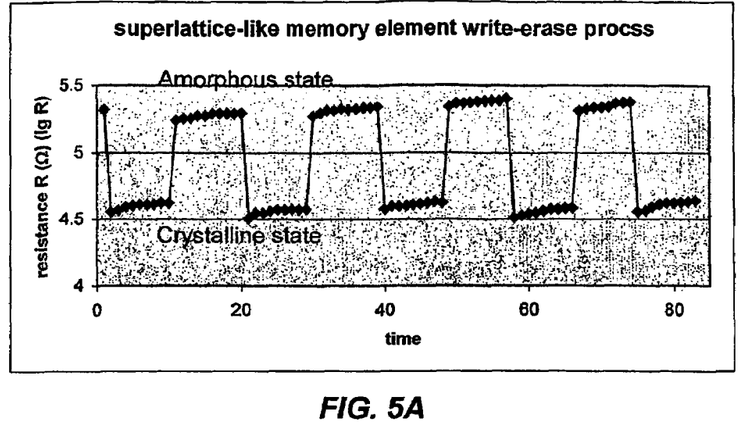
FIG. 5A is a graph showing an experimental curve of the write-erase properties of the memory medium according to the present invention.
Figure 5B:
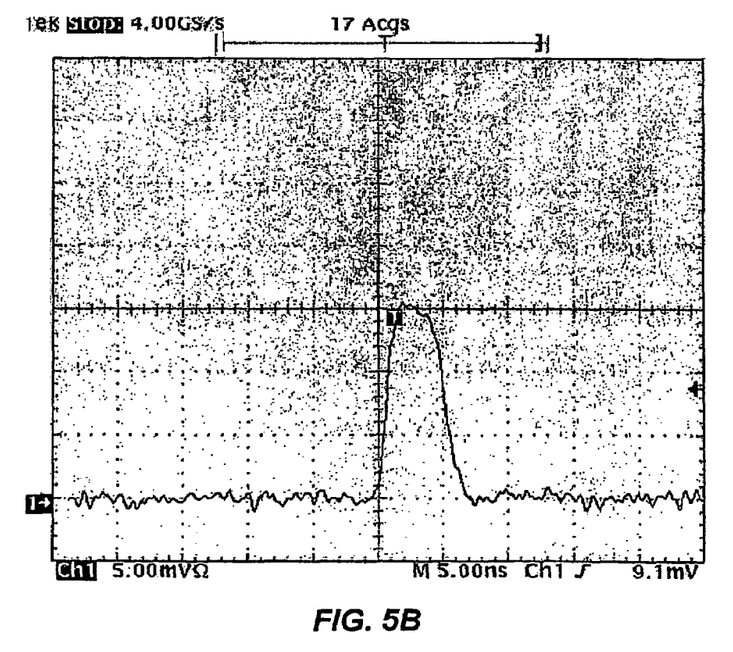
FIG. 5B is an oscilloscope screen print showing a pulse current curve during a data-writing process of the memory medium according to the present invention.

Experiments show that the data recording element of a memory device is capable of converting phases between crystalline state and amorphous state in response to an electrical pulse of less than about 10 ns, in either a data writing process or a data erasing process. FIG. 5A shows an experimental result of an electrical pulse applied to a memory medium according to one embodiment of the present invention, which demonstrates that the data recording element is converted from crystalline state into amorphous state in response to a 7 ns pulse width of an writing current, and is converted from the amorphous state into crystalline state in response to a 10 ns pulse width of an erasing current. There is also shown that the resistance difference between the amorphous state and the crystalline state could be up to one order. The 7 ns writing current pulse captured by an oscilloscope is shown in FIG. 5B. These results show that for a memory medium according to the present invention, both the data-writing and the data-erasing duration can be significantly reduced as compared to the conventional C-RAM device. The writing current pulse and the erasing current pulse can either be a single pulse or a chain of multi-pulses.

Figure 6:
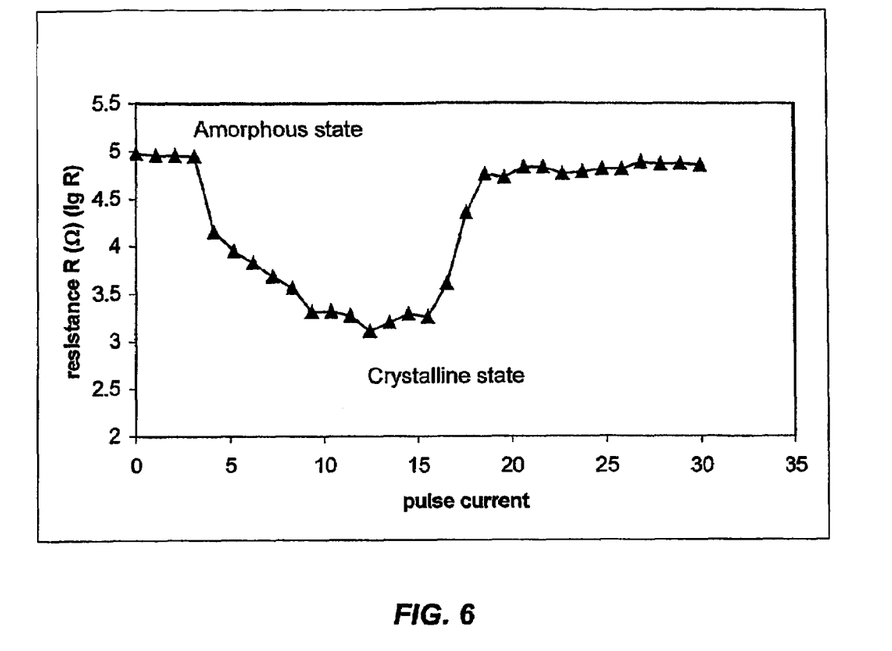
FIG. 6 is a graph showing the resistance against pulse current of the memory medium according to the present invention.

FIG. 6 shows the relationship between the pulse current and the resistance of the memory medium according to the present invention. As shown in FIG. 6, when an amplitude of a current applied to a memory medium reaches a certain level, the medium will switch from amorphous state to crystalline state. To switch the state for a memory medium according to the present invention, the pulse current only needs to have a width of about 7 ns, which is significantly lower than about 50 ns to 100 ns needed for a conventional C-RAM medium and the current value is about 50% lower than that needed for a conventional C-RAM medium.

Figure 7:
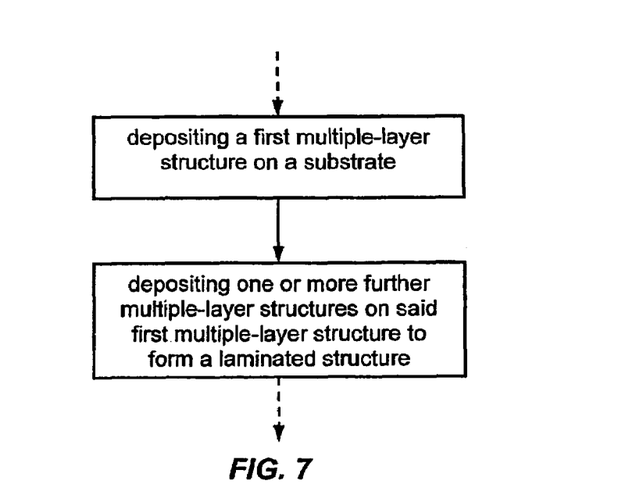
FIG. 7 is a flow chart showing a method of producing a memory cell for a writeable and erasable memory medium according to the present invention.

As shown in FIG. 7, a method 700 of producing a data recording element for a memory cell of electrically writeable and erasable memory medium according to the present invention is provided. The method comprises, in a first block 710, depositing a first multiple-layer structure on a substrate and in a next block 720, depositing one or more further multiple-layer structures on said first multiple-layer structure to form a laminated structure. Said multiple-layer structure first deposited has at least two layers, at least one of said layers is made of a material capable of changing phase between a crystalline state and an amorphous state in response to an electrical pulse. Said further multiple-layer structures comprises at least two layers, at least one of said layers is made of a material-capable of changing phase between a crystalline state and an amorphous state in response to an electrical pulse. One of the individual layers is made of a material having at least one atomic element which is absent from another individual layer.

In one embodiment, the first or further multiple-layer structure is deposited according to same or different sequence. In another embodiment, a final individual layer is further deposited on the further multiple-layer structure, which is made of material same as the first individual layer of the multiple-layer structure. Both the first individual layer and the final individual layer have a crystallization speed higher than that of other layers of the multiple-layer structure, and have a crystallization temperature lower than that of other layers of the multiple-layer structure. Preferably, the crystallization temperature of said first individual layer and final individual layer is in a range of about 90° C. to 120° C.

Figure 8:
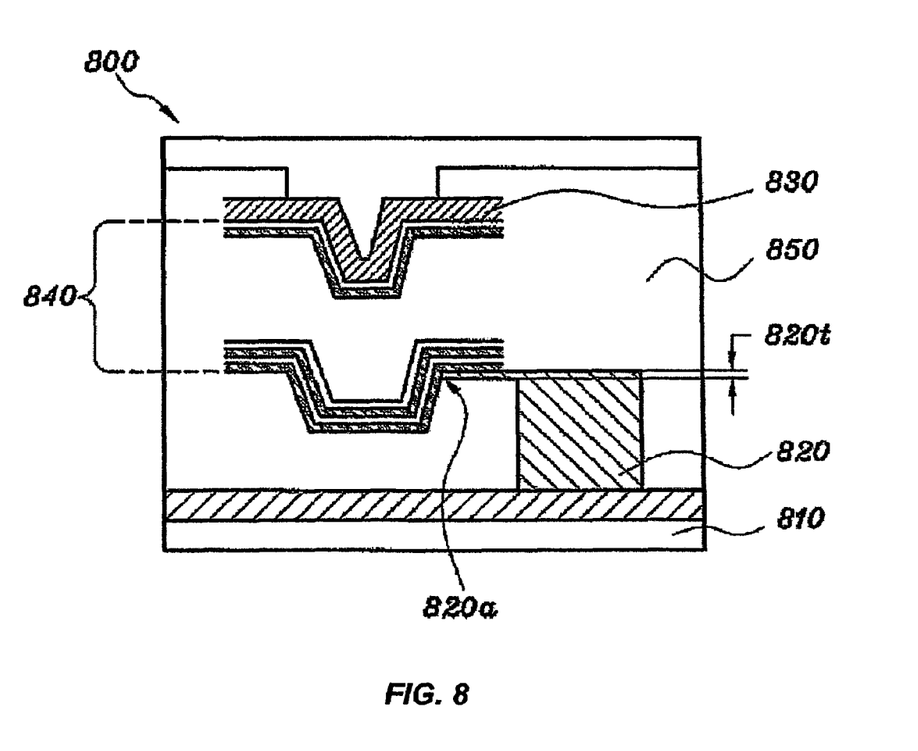
FIG. 8 is a partial cross sectional view of a memory cell of the electrically writeable and erasable memory medium according to a further embodiment of the present invention.

FIG. 8 shows an electrically writeable and erasable memory medium according to a further embodiment of the present invention. In this embodiment, a memory cell 800 of an electrically writeable and erasable memory medium comprises a substrate such as a semiconductor wafer 810, a bottom electrode 820 and a top 830 formed on the substrate 810. A data recording element 840 is formed between the top and bottom electrodes 820 and 830 and surrounded with insulator 850. The bottom electrode 820 is formed adjacent to, and with an edge 820a contacting, the data recording element 840. Under this configuration, the contact area between the data recording element 840 and the bottom electrode 820 is determined by the thickness 820t of the bottom electrode 820. By controlling the thickness of the bottom electrode 820, the contacting area can be greatly reduced. A reduced contact area also contributes to the reduction of electrical current for writing/reading information to/from the data recording element, which complements the heat transfer suppression effect induced by the multiple layer structure.

Although embodiments of the present invention have been illustrated in conjunction with the accompanying drawings and described in the foregoing detailed description, it should be appreciated that the invention is not limited to the embodiments disclosed, and is capable of numerous rearrangements, modifications, alternatives and substitutions without departing from the spirit of the invention as set forth and recited by the following claims.

The invention claimed is:

1. A data recording element comprising:
    a plurality of multiple-layer structures wherein each of said plurality of multiple-layer structures comprises of a plurality of layers of phase change materials;
    a first layer of each of said plurality of layers being a first phase change material;
    a second layer of each of said plurality of layers being a second phase change material having at least one atomic element absent from said first phase change material;
    an initial layer of phase change material that is a first layer of said plurality of layers of a first one of said plurality of multiple-layer structures;
    a final layer of phase change material over a final one of said plurality of multiple-layer structures wherein said phase change material of said initial layer and said phase change material of said final layer have a lower crystallization temperature and a higher crystallization speed than phase change materials in a remainder of said plurality of layers in each of said plurality of multiple-layer structures, wherein said crystallization temperature of said phase change material of said initial layer and said phase change material of said final layer is in a range from about 90 degrees Celsius to about 120 degrees Celsius.

2. The data recording element of claim 1 further comprising:
a one of said plurality of multiple-layer structures including a first plurality of layers disposed in a sequence; and
a second one of said plurality of multiple-layer structures including a second plurality of layers disposed in said sequence.

3. The data recording element of claim 1 further comprising:
a one of said plurality of multiple-layer structures including a first plurality of layers disposed in a first sequence; and
a second one of said plurality of multiple-layer structures including a second plurality of layers disposed in a second sequence.

4. The data recording element of claim 1 further comprising:
each layer of said plurality of layers in each of said plurality of multiple-layer structures having a thickness in a range of about 0.1 nm to about 10 nm.

5. The data recording element of claim 1 wherein said plurality of layers in each of said multiple-layer structures comprise:
a first one of said plurality of layers has a first thickness; and
a second one of said plurality of layers has said first thickness.

6. The data recording element of claim 1 wherein said plurality of layers in each of said multiple-layer structures comprise:
a first one of said plurality of layers; and
a second one of said plurality of layers adjacent said first one of said plurality of layers wherein a ratio of thickness of said second one of said plurality of layers to said first one of said plurality of layers is between about 0.1 and 10.

7. The data recording element of claim 1 wherein said data recording element has a total thickness of about 5 nm to about 500 nm.

8. The data recording element of claim 1 wherein said data recording element has a total thickness of about 5 nm to about 100 nm.

9. The data recording element of claim 1 wherein said final layer and each of said plurality of layers in each of said multiple-layer structures comprises:
a material selected from a group consisting of: Ge, Te, Sb, GeTe, SbTe, AgIn, Ge, Sb, Te, AgInSbTe, TeAsGe, TeSeS, TeSeSb, InSbTe, TeGeSn, In, Cr, N, Se, Sn, Si, Bi, and Ag.

10. The data recording element of claim 1 further comprising:
a layer selected from one of said final layer and each of said plurality of layers in each of said multiple-layer structures that is in a crystalline state when deposited.

11. The data recording element of claim 1 further comprising:
a layer selected from one of said final layer and each of said plurality of layers in each of said multiple-layer structures that has a lower resistance in said crystalline state than in an amorphous state.

12. The data recording element of claim 1 further comprising:
a superlattice-like structure formed from said plurality of multiple-layer structures and said final layer.

13. A memory cell comprising:
a substrate;
a first contact formed over said substrate;
a plurality of multiple-layer structures over said first contact wherein each of said plurality of multiple-layer structures comprises of a plurality of layers of phase change materials;
a first layer of each of said plurality of layers being a first phase change material;
a second layer of each of said plurality of layers being a second phase change material having at least one atomic element absent from said first phase change material;
an initial layer of phase change material that is a first layer of said plurality of layers of a first one of said plurality of multiple-layer structures;
a final layer of phase change material over a final one of said plurality of multiple-layer structures wherein said phase change material of said initial layer and said phase change material of said final layer have a lower crystallization temperature and a higher crystallization speed than phase change materials in a remainder of said plurality of layers in each of said plurality of multiple-layer structures; and
a second contact wherein said crystallization temperature of said phase change material of said initial layer and said phase change material of said final layer is in a range from about 90 degrees Celsius to about 120 degrees Celsius formed over said final layer.

14. The memory cell of claim 13 further comprising:
a layer of insulating material between said first contact and said substrate.

15. The memory cell of claim 13 further comprising:
an insulating material that isolates said memory cell from an adjacent memory cell.

16. The memory cell of claim 13 further comprising:
a one of said plurality of multiple-layer structures including a first plurality of layers disposed in a sequence; and
a second one of said plurality of multiple-layer structures including a second plurality of layers disposed in said sequence.

17. The memory cell element of claim 13 further comprising:
a one of said plurality of multiple-layer structures including a first plurality of layers disposed in a first sequence; and
a second one of said plurality of multiple-layer structures including a second plurality of layers disposed in a second sequence.

18. The memory cell of claim 13 further comprising:
each layer of said plurality of layers in each of said plurality of multiple-layer structures having a thickness in a range of about 0.1 nm to about 10 nm.

19. The memory cell of claim 13 wherein said plurality of layers in each of said multiple-layer structures comprise:
a first one of said plurality of layers has a first thickness; and
a second one of said plurality of layers has said first thickness.

20. The memory cell of claim 13 wherein said plurality of layers in each of said multiple-layer structures comprise:
a first one of said plurality of layers; and
a second one of said plurality of layers adjacent said first one of said plurality of layers wherein a ratio of thickness of said second one of said plurality of layers to said first one of said plurality of layers is between about 0.1 and 10.

21. The memory cell of claim 13 wherein said data recording element has a total thickness of about 5 nm to about 500 nm.

22. The memory cell of claim 13 wherein said data recording element has a total thickness of about 5 nm to about 100 nm.

23. The memory cell of claim 13 wherein said final layer and each of said plurality of layers in each of said multiple-layer structures comprises:
   a material selected from a group consisting of: Ge, Te, Sb, GeTe, SbTe, AgIn, Ge, Sb, Te, AgInSbTe, TeAsGe, TeSeS, TeSeSb, InSbTe, TeGeSn, In, Cr, N, Se, Sn, Si, Bi, and Ag.

24. The memory cell of claim 13 further comprising:
   a layer selected from one of said final layer and each of said plurality of layers in each of said multiple-layer structures that is in a crystalline state when deposited.

25. The memory cell of claim 13 further comprising:
   a layer selected from one of said final layer and each of said plurality of layers in each of said multiple-layer structures that has a lower resistance in said crystalline state than in an amorphous state.

26. The memory cell of claim 13 further comprising:
   a superlattice-like structure formed from said plurality of multiple-layer structures and said final layer.

* * * * *

UNITED STATES PATENT AND TRADEMARK OFFICE
CERTIFICATE OF CORRECTION

PATENT NO. : 7,718,987 B2
APPLICATION NO. : 10/589915
DATED : May 18, 2010
INVENTOR(S) : Tow Chong Chong et al.

It is certified that error appears in the above-identified patent and that said Letters Patent is hereby corrected as shown below:

Col 10, claim 13, lines 26–31, delete "structures; and
a second contact wherein said crystallization temperature of said phase change material
of said initial layer and said phase change material of said final layer is in a range from
about 90 degrees Celsius to about 120 degrees Celsius formed over said final layer."

and insert:

--structures, wherein said crystallization temperature of said phase change material of
said initial layer and said phase change material of said final layer is in a range from
about 90 degrees Celsius to about 120 degrees Celsius; and
      a second contact formed over said final layer.--

Signed and Sealed this

Nineteenth Day of October, 2010

David J. Kappos
*Director of the United States Patent and Trademark Office*